United States Patent
Fessler et al.

[11] Patent Number: 5,878,630
[45] Date of Patent: Mar. 9, 1999

[54] GEAR BOX CONTROL COOLING

[75] Inventors: Bernhard Fessler; Josef Schwarz, both of Friedrichshafen; Gerhard Birkenmaier, Meckenbeuren, all of Germany

[73] Assignee: ZF Friedrichshafen AG, Friedrichshafen, Germany

[21] Appl. No.: 945,062

[22] PCT Filed: May 7, 1996

[86] PCT No.: PCT/EP96/01898

§ 371 Date: Oct. 20, 1997

§ 102(e) Date: Oct. 20, 1997

[87] PCT Pub. No.: WO96/35894

PCT Pub. Date: Nov. 14, 1996

[30] Foreign Application Priority Data

May 12, 1995 [DE] Germany .................. 195 17 491.7

[51] Int. Cl.[6] .................................................. F16H 57/04
[52] U.S. Cl. .......................................... 74/606 A; 74/335
[58] Field of Search .................. 74/606 A, 335; 477/98; 174/15.1, 16.1; 361/688, 689, 690

[56] References Cited

U.S. PATENT DOCUMENTS

| | | | |
|---|---|---|---|
| 5,165,468 | 11/1992 | Tajima et al. | 74/606 A X |
| 5,277,663 | 1/1994 | Lemme et al. | 74/606 A X |
| 5,662,007 | 9/1997 | Starker et al. | 74/606 A |
| 5,678,461 | 10/1997 | Stine | 74/606 A |
| 5,811,747 | 9/1998 | Taniguchi et al. | 200/61.88 |

FOREIGN PATENT DOCUMENTS

| | | |
|---|---|---|
| 2 621 869 | 4/1989 | France . |
| 33 07 654 A1 | 9/1984 | Germany . |
| 93 07 228.7 | 8/1993 | Germany . |

*Primary Examiner*—Dirk Wright
*Assistant Examiner*—Peter T. Kwon
*Attorney, Agent, or Firm*—Davis and Bujold

[57] ABSTRACT

A method and apparatus for cooling of a controller (16) of a transmission of a motor vehicle (6). A motor vehicle (6) has a transmission (2) in which or on which is provided a control mechanism (16, 18) actuated by a control fluid (40). The control electronic system (30, 32, 38) of the controller (16) is compulsorily cooled by a ducted supply of a control fluid (40) to the electronic system (30, 32, 38) or through the control electronic system (30, 32, 38). The control fluid (40) may be driven by a conveyor mechanism through a cooling channel (36) upon which the control electronic system is mounted with optimum heat conductivity.

26 Claims, 1 Drawing Sheet

GEAR BOX CONTROL COOLING

The invention concerns an electronic control for transmissions of motor vehicles.

BACKGROUND OF THE INVENTION

Electronic systems for the control of the gearshift cycles are being increasingly used in mechanical transmissions. It is advantageous that the electronic system be accommodated on or in the transmission. The electronics is, of course, here exposed to extreme environmental conditions.

German Utility Model No. G 93 07 228 has disclosed a transmission control which is mounted within the transmission housing. The control here can be surrounded by transmission oil and radiate heat to the oil via cooling elements. The cooling of the control is essentially assumed by the transmission oil. In this arrangement, damage to the transmission control can only be rectified when the transmission is removed and dismounted from the vehicle. This requires an enormous after-sale expense which is in no proportion to the exchange of eventually inexpensive parts. The electronic system is constantly surrounded by aggressive transmission oil which, in case of damage to the seal or paint, results in an interruption in operation of the electronics.

SUMMARY OF THE INVENTION

Therefore, the invention is based on the problem of providing a transmission control where cooling of the electronics is reliable and simplified.

The electronic system of the transmission control of an automatic or automated transmission is mounted outside the transmission housing. Here it is advantageously in the area of the control means for actuating the transmission. Especially hydraulic or pneumatic actuators, preferably operated by fluids, belong to said control means. In the case of pneumatic actuators, they are supplied with compressed air from a compressed-air tank according to a control for actuating transmission elements. In the case of hydraulic actuators, this is accordingly done with hydraulic oil from an oil tank. Air is preferably used as a control fluid, but the following considerations can also be correspondingly applied to hydraulic actuators, an adapted seal has to be provided and, if needed, a cooler for the hydraulic oil.

During operation of a pneumatic actuator having two chambers, air is introduced in one chamber and an adjusting piston, which separates the two chambers of the actuator, is moved so as to force out the air from the other respective chamber. Said air is used, according to the invention, to cool the electronics. Both the forced out exhaust air and the control air flowing in can be used.

Three kinds of air actuation for cooling are distinguished:
1. the released air is directly used for blowing in from outside the parts to be cooled separately or as whole;
2. the electronic parts or units are designed so that the air can flow through them; and
3. the air flows through a cooling plate which is connected with the electronics so that heat from the electronic parts, separately or as whole, can be transmitted to said cooling plate.

In the first and second cases, the heat is eliminated by the blown in or blown through air. In the second case, the cooling plate first absorbs the heat and then radiates it to the air that flows past.

The moment of the air flow can be dealt with, separately or combined in different ways:

1. the cooling air is continuously fed to the parts or to the unit;
2. the cooling air is fed to the parts or units only during operation of the pneumatic actuators;
3. the cooling air is fed to the parts or units in accordance with a measured temperature after exceeding a limit temperature; and
4. the cooling air is fed, after shutting off the vehicle, in order to eliminate accumulated heat.

The continuous air flow feed, according to point 1, is regulated via a throttle device. A temperature-dependent supply, according to point 3, is effected via temperature-controlled gearshift devices which, if needed, ensure a forced air supply, for example, via ventilators. In point 4, a forced air supply is likewise effected, for example, via ventilators.

By means of a heat-insulating barrier layer, the electronic parts can be insulated, relative to the other controller or also other adjacent parts of the transmission, so as to interrupt the transmission of heat in a direction toward the electronic parts.

BRIEF DESCRIPTION OF THE DRAWING(S)

The invention is described in detail with the aid of the figures. They show:

The invention is described in detail with the aid of the figures. They may show:

FIG. 1 a vehicle transmission with a mounted controller;

FIG. 2 a digrammatic controller with blown in air; and

FIG. 3 is a diagrammatic controller with a cooling plate.

DESCRIPTION OF THE PREFERRED EMBODIMENT(S)

Figure 1:
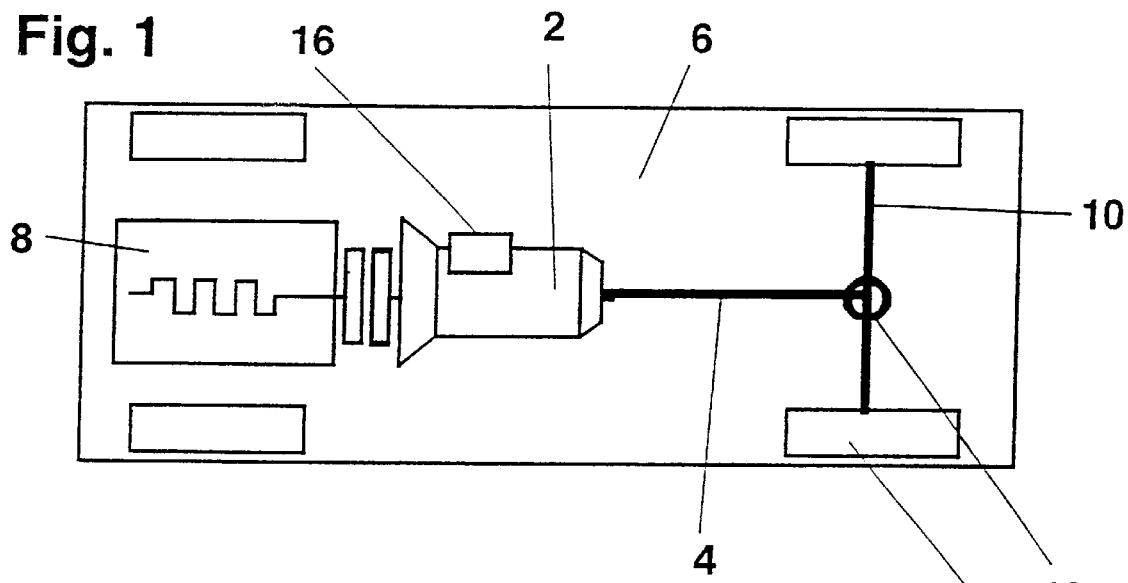

FIG. 1 diagrammatically shows a vehicle transmission 2 which is provided in a power train 4 of a vehicle 6 between a drive motor 8 and a differential 12, with an output shaft 10 and rear-mounted wheels 14. A controller 16 is provided on the vehicle transmission 2 and is preferably mounted so that parts of the controller 16 project into the vehicle transmission 2 where they interacts with actuators, not shown here, of the gearshift devices of the transmission.

Figure 2:
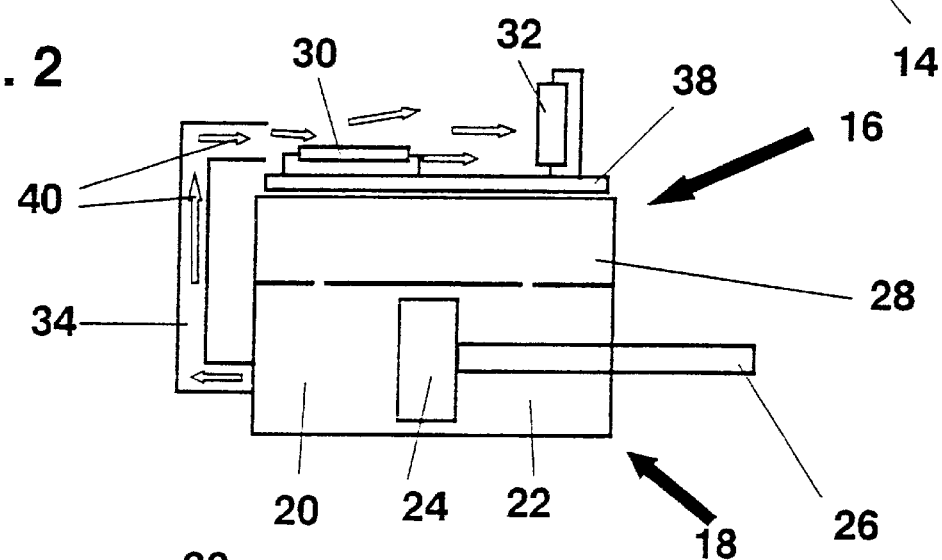

FIG. 2 shows, in a diagrammatic representation, an enlargement of the controller 16. The cylinder unit 18 has two chambers 20 and 22 separated by a piston 24. A connecting rod 26 which interacts with the gearshift devices, not shown here, of the transmission control is connected to the piston 24. The chambers 20 and 22 are each supplied with air via a unit, not described in further detail, having actuators 28. The electronic parts 30 and 32, diagrammatically shown upon a sheet plate 38, for control of the actuator unit 28 are here mounted directly on the actuator unit 28.

If the chamber 22 in the arrangement shown here is aerated, then the piston 24 is moved to the left and removes air 40 from the chamber 20. Said air 40 is concentrated on the parts 30 and 32 by a feedpipe 34 in such a manner that the air passes across the parts 30 and 32 and removes heat to the environment.

Figure 3:
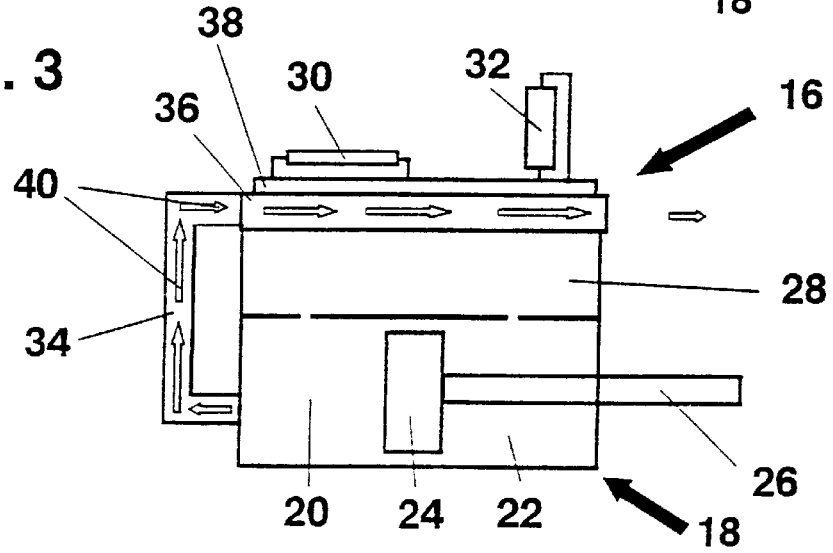

FIG. 3 shows, based on FIG. 2, a cooling channel 36 provided between the actuator unit 28 and the parts 30 and 32. The cooling channel 36 absorbs the heat produced by the parts 30 and 32. Means can be provided, between the sheet plate 38 and the cooling channel 36, for improving the heat conductivity. One such means constitutes, for example, a heat-conductive paste. The air 40, supplied by the feedpipe 34, is led through the cooling channel 36 and removes the heat absorbed by the cooling channel 36 to the environment.

We claim:

1. A controller (16) having control means (16, 18) actuated by a control fluid (40) and functionally coordinated with a control electronic system (30, 32, 38), the controller being a transmission controller of a transmission (2) for a motor vehicle (6), and said control electronic system (30, 32, 38) being one of mounted in and on said transmission (2);

wherein said control electronic system (30, 32, 38) is compulsorily cooled by a ducted supply of said control fluid (40).

2. The controller (16) according to claim 1, wherein the supply of fluid is designed so that said control fluid (40) is fed to the transmission control during actuation of said control means (16, 18).

3. The controller (16) according to claim 1, wherein the supply of said control fluid (40) is continuously supplied.

4. The controller (16) according to claim 1, wherein the supply of said control fluid (40) is supplied based upon a sensed temperature.

5. The controller (16) according to claim 1, wherein the supply of said control fluid (40) is continued after shutting off said vehicle (6).

6. The controller (16) according to claim 1, wherein said control electronic system (30, 32, 38) is designed so that said control fluid (40) flows through said control electronic system (30, 32, 38).

7. The controller (16) according to claim 1, wherein said control electronic system (30, 32, 38) is mounted upon a cooling plate (36) through which said control fluid (40) flows.

8. The controller (16) according to claim 7, wherein means for improving heat conductivity is provided between said control electronic system (30, 32, 38) and said cooling plate (36).

9. The controller (16) according to claim 8, wherein said means for improving heat conductivity is a heat conductive paste.

10. The controller (16) according to claim 1, wherein said control fluid (40) is compulsorily guided by a conveyor device.

11. The controller (16) according to claim 10, wherein said conveyor device is a ventilator.

12. The controller (16) according to claim 10, wherein said conveyor device is a pump.

13. The controller (16) according to claim 1, wherein said control fluid (40) is air.

14. The controller (16) according to claim 1, wherein said control fluid (40) is a hydraulic oil.

15. The controller (16) according to claim 1, wherein said control electronic system (30, 32, 38) is designed so as to be heat-insulated relative to other components of said controller (16, 18) and of said transmission (2).

16. A process for cooling an electronic system (30, 32, 38) of a controller (16) having control means (16, 18) actuated by a control fluid (40), the controller being a transmission controller of a transmission (2) for a motor vehicle (6); said process comprising the steps of:

one of mounting said control electronic system (30, 32, 38) in or on said transmission (2); and compulsory guiding a ducted control fluid (40) into an area of said electronic system (30, 32, 38) for sufficient cooling of said electronic system (30, 32, 38).

17. A process for cooling according to claim 16, further comprising the step of passing said control fluid (40) into the area of said electronic system (30, 32, 38) during actuation of said control means (16, 18).

18. The process for cooling according to claim 16, further comprising the step of continuously passing said control fluid (40) into the area of said electronic system (30, 32, 38).

19. The process for cooling according to claim 16, further comprising the step of measuring a temperature in the area of said electronic system (30, 32, 38) and passing said control fluid (40) into the area of said electronic system (30, 32, 38) after exceeding a temperature limit.

20. The process for cooling according to claim 16, further comprising the step of continuing the supply of said control fluid (40), after shutting off said vehicle (6), in order to eliminate any accumulated heat in the area of said electronic system (30, 32, 38).

21. The process for cooling according to claim 16, further comprising the step of passing said control fluid (40) through a cooling plate (36) upon which said electronic system (30, 32, 38) is mounted.

22. The process for cooling according to claim 16, further comprising the step of passing said control fluid (40) into the area of said electronic system (30, 32, 38) by fluid-conveyor means.

23. The process for cooling according to claim 21, further comprising the step conveying said control fluid (40) via a ventilator.

24. The process for cooling according to claim 21, further comprising the step of conveying said control fluid (40) via a pump.

25. The process for cooling according to claim 16, further comprising the step of using air as said control fluid (40).

26. The process for cooling according to claim 16, further comprising the step of using hydraulic oil as said control fluid.

* * * * *